(12) United States Patent
Kao et al.

(10) Patent No.: US 8,653,869 B2
(45) Date of Patent: Feb. 18, 2014

(54) SEGMENTED FRACTIONAL-N PLL

(75) Inventors: Tsung-Kai Kao, Hsinchu County (TW);
Che-Fu Liang, New Taipei (TW);
Michael A. Ashburn, Jr., Groton, MA (US)

(73) Assignee: Media Tek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/615,441

(22) Filed: Sep. 13, 2012

(65) Prior Publication Data

US 2013/0099839 A1 Apr. 25, 2013

Related U.S. Application Data

(60) Provisional application No. 61/549,501, filed on Oct. 20, 2011.

(51) Int. Cl.
*H03L 7/06* (2006.01)

(52) U.S. Cl.
USPC .......................... 327/159; 375/376; 327/150

(58) Field of Classification Search
USPC ................. 327/156–163, 147–151, 105, 107;
375/373–376; 331/2–35, 172
See application file for complete search history.

(56) References Cited

U.S. PATENT DOCUMENTS

| | | | |
|---|---|---|---|
| 6,236,703 B1 | 5/2001 | Riley | |
| 6,920,622 B1 | 7/2005 | Garlepp | |
| 7,181,180 B1 * | 2/2007 | Teo et al. | 455/260 |
| 7,417,510 B2 * | 8/2008 | Huang | 331/74 |
| 7,667,508 B2 * | 2/2010 | Lesso | 327/156 |
| 2002/0021153 A1 | 2/2002 | Saeki | |
| 2005/0028685 A1 | 2/2005 | Yamamoto | |
| 2005/0285685 A1 | 12/2005 | Frey | |
| 2008/0164917 A1 | 7/2008 | Floyd | |

FOREIGN PATENT DOCUMENTS

| | | |
|---|---|---|
| EP | 1 341 309 A1 | 9/2003 |
| WO | 86 05046 A1 | 8/1986 |
| WO | 2008039766 A2 | 4/2008 |
| WO | 2008039766 A3 | 4/2008 |

OTHER PUBLICATIONS

Adams, A 113-dB SNR Oversampling DAC with Segmented Noise-Shaped Scrambling, IEEE Journal of Solid-State Circuits, pp. 1871-1878, vol. 33, No. 12, Dec. 1998.

* cited by examiner

*Primary Examiner* — Lincoln Donovan
*Assistant Examiner* — Thomas Skibinski
(74) *Attorney, Agent, or Firm* — Winston Hsu; Scott Margo

(57) ABSTRACT

A Fractional-N PLL includes a phase frequency detector module receiving a first clock and a second clock that is associated with a feedback path arrangement. A coarse phase adjustment module receives a coarse phase component and an output signal associated with a divider module used in the feedback path arrangement and performs a coarse phase adjustment. A fine phase adjustment module performs fine phase adjustment using a fine phase component and the coarse phase adjustment as input to produce the second clock. The fine phase adjustment module nominally cancels most or all of the quantization noise present during the coarse phase adjustment, thereby greatly reducing the net phase noise of the divider module. A segmentation module receives a control signal and generates the coarse phase component and the fine phase component that are provided to the fine phase adjustment module and the coarse phase adjustment module for processing.

20 Claims, 14 Drawing Sheets

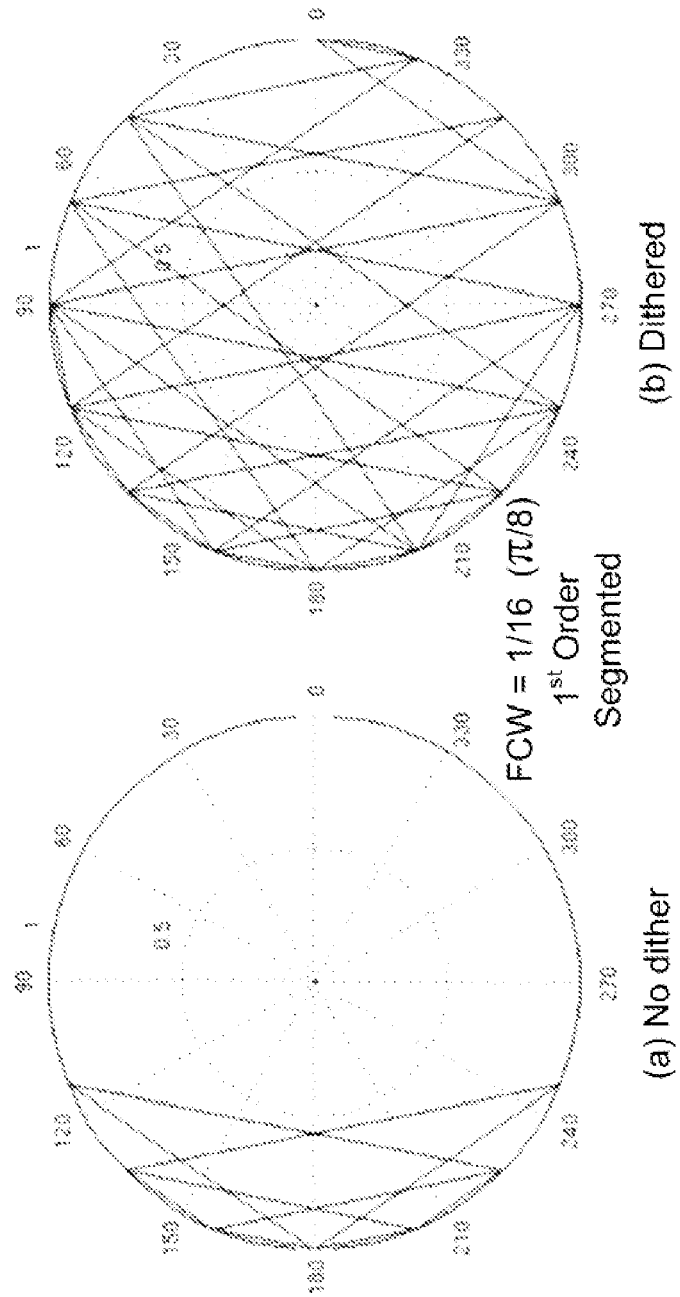
FIG. 3A (a) No dither
FIG. 3B (b) Dithered
FCW = 1/16 (π/8) 1st Order Segmented

SEGMENTED FRACTIONAL-N PLL

CROSS REFERENCE TO RELATED APPLICATIONS

This application claims the benefit of U.S. provisional application No. 61/549,501, filed on Oct. 20, 2011, and incorporated herein by reference.

BACKGROUND

The invention is related to the field of PLL, and in particular to a segmented Fractional-N PLL.

In a traditional Integer-N PLL, if finer output frequency resolution is desired, one approach is to pre-divide the input clock in order to lower the reference clock frequency. Since the output frequency is an integer (N) times the input frequency, a slower reference clock results in a finer frequency resolution. Using this approach, the maximum achievable PLL bandwidth is reduced since the loop bandwidth should not greatly exceed 10% of the reference clock frequency. Lowering the loop bandwidth sacrifices VCO phase noise and increases layout area due to the larger capacitors sizes required in the loop filter. The other approach to achieve finer frequency resolution with an integer-N PLL is to increase the output frequency and then divide down the resulting VCO output clock. This approach has the significant disadvantage of increased power consumption due to the higher clock rate.

A better approach to derive finer output frequency resolution is to use a Fractional-N PLL. With this approach, the feedback divider is typically controlled by a delta-sigma modulator such that the average divider setting achieves the desired (fractional) value. In using a delta-sigma modulator to control the feedback divider, the quantization noise induced by the modulator will be shaped such that it is placed mostly at higher frequencies. The quantization noise can then be attenuated by the PLL's low-pass characteristic as seen at its input. While the Fractional-N approach enables a higher reference clock rate thereby enabling a higher loop bandwidth as set by stability constraints, the filtering constraints imposed by quantization noise may still limit the loop bandwidth to an undesired level.

One efficient method to soften the PLL bandwidth requirement resulting from quantization noise is to reduce the feedback divider step using sub-phase generation. However, if the sub-phase generation circuit (phase interpolator, delay line or other method) has non-idealities (mismatch, gain error and any other effects), the sub-phase generation circuit inevitably introduces spurs into the PLL system. Note these spurs would be in addition to the fractional spurs that can result from native idle tones in the delta-sigma modulator.

SUMMARY

According to one aspect of the invention, there is provided a Fractional-N PLL. The Fractional-N PLL includes a phase frequency detector module that receives a first clock and a second clock that is associated with a feedback path arrangement. A coarse phase adjustment module receives a coarse phase component and an output signal associated with a divider module used in the feedback path arrangement and performs a coarse phase adjustment. A fine phase adjustment module performs fine phase adjustment using a fine phase component and the coarse phase adjustment as input to produce the second clock. The fine phase adjustment module nominally cancels most or all of the quantization noise present during the coarse phase adjustment, thereby greatly reducing the net phase noise of the divider module. A segmentation module receives a control signal and generates the coarse phase component and the fine phase component that are provided to the fine phase adjustment module and the coarse phase adjustment module for processing.

According to another aspect of the invention, there is provided a method of performing the operation of a Fractional-N PLL device. The method includes receiving a first clock and a second clock that is associated with a feedback path arrangement using a phase frequency detector module. Also, the method includes receiving a coarse phase component and an output signal associated with a divider module used in the feedback path arrangement and performs a coarse phase adjustment using a coarse phase adjustment module. Moreover, the method includes performing fine phase adjustment using a fine phase adjustment module that receives a fine phase component and the coarse phase adjustment as input to produce the second clock. The fine phase adjustment module nominally cancels most or all of the quantization noise present during the coarse phase adjustment, thereby greatly reducing the net phase noise of the divider module. Furthermore, the method includes receiving a control signal and generating the coarse phase component and the fine phase component using a segmentation module that are provided to the fine phase adjustment module and the coarse phase adjustment module for processing.

BRIEF DESCRIPTION OF THE DRAWINGS

FIGS. 3A-3B are polar plots illustrating first order segmentation;

DETAILED DESCRIPTION

In accordance with an exemplary embodiment of the invention there is provided architecture for a segmented Fractional-N PLL that segments sub-phase information into two parts, a coarse phase component (MSB) and a fine phase component (LSB). The MSB includes signal (target divide value) and quantization noise, while the LSB includes only quantization noise. In this approach, a phase interpolator can be used to nominally cancel most or all of the quantization noise present during MSB phase adjustment, thereby greatly reducing the net phase noise of the divider.

Figure 1:
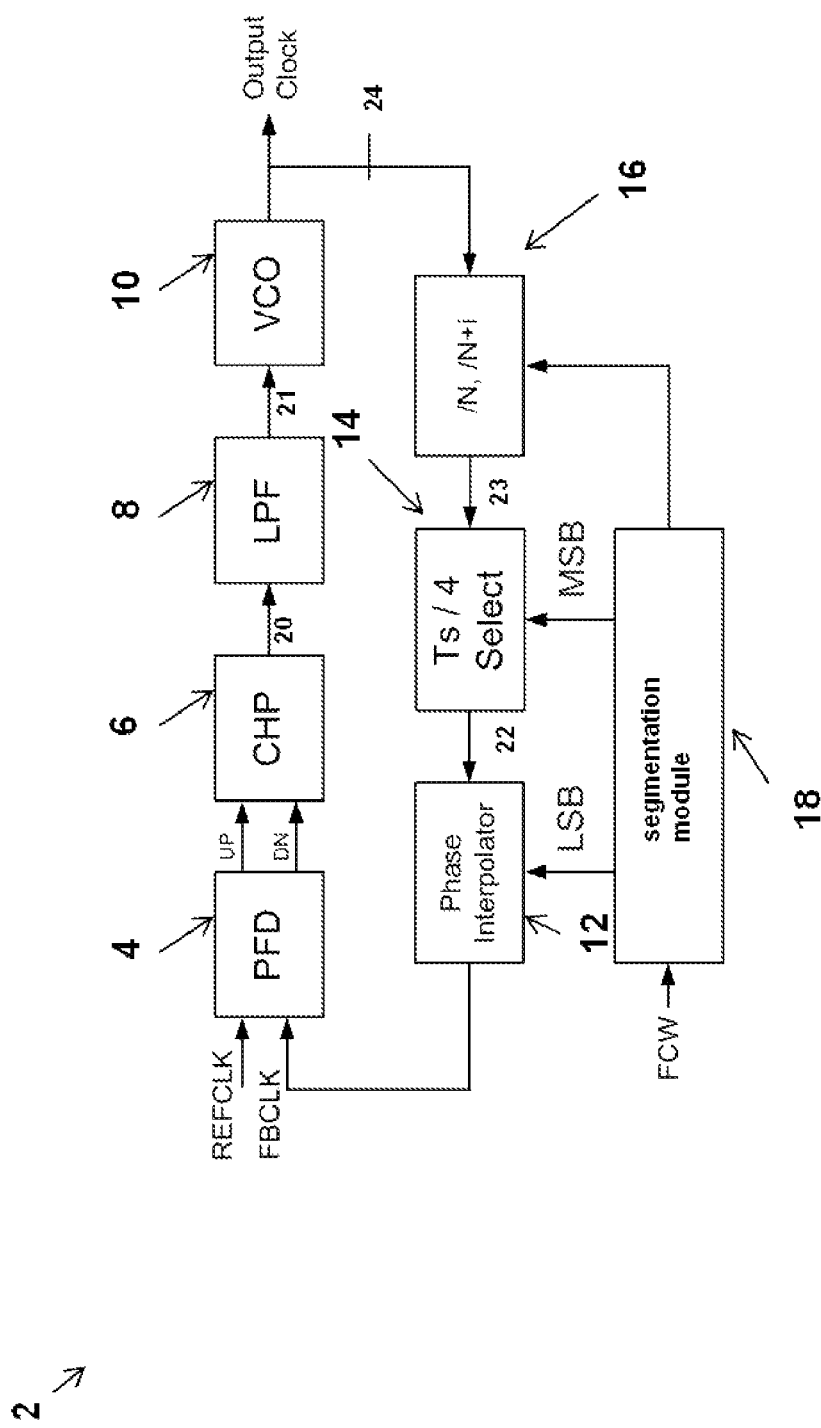
FIG. 1 is a schematic diagram illustrating a Fractional-N PLL formed in accordance with the invention.

FIG. 1 shows a Fractional-N PLL 2 formed in accordance with the invention. The Fractional-N PLL 2 includes a phase frequency detector (PFD) 4 that references as input an external clock signal REFCLK and a feedback clock signal FBCLK. The PFD 4 sends two outputs signals (UP and DN) to a charge pump (CHP) 6, where the charge pump 6 outputs to a low pass filter (LPF) 8 that filters the output signal 20 and the filtered signal 21 is provided to a voltage controlled oscillator (VCO) 10. The output of the VCO 10 is a clock signal 24 and is provided to a divider (denoted by '/N, /N+i' in FIG. 1) 16 which divides the output of the VCO 10. The invention includes a segmentation module 18 that provides as output the coarse phase component (MSB) and the fine phase component (LSB). Also, the segmentation module 18 provides a control signal to the divider 16 for timing purposes.

An MSB phase selector (denoted by 'Ts/4 Select' in FIG. 1) 14 receives the MSB and the output 23 of the divider 16 as input and performs MSB phase adjustments. In this case, the MSB phase selector 14 is implemented as a Ts/4 selector, where Ts is the VCO clock cycle. A phase interpolator 12 performs LSB phase adjustment by receiving the output 22 of the MSB phase selector 14 and the LSB from the segmentation module 18.

As discussed above, the phase interpolator 12 is used to provide fine adjustment of the phase while the coarse (MSB) adjustment is implemented with a Ts/4 selector. The latter can be implemented using sub-phases of the VCO clock, or alternatively by running the VCO clock at higher frequencies and then dividing down the clock. As will be discussed later, the MSB (coarse) phase selector 14 need not represent sub-phase selection, it could have a phase step of an entire VCO clock cycle ($T_S$) or even larger. If the MSB phase selector 14 (step) is set equal to or greater than $T_S$, the coarse phase selection can be achieved simply by just using the variable modulus divider 16.

There are different approaches that can be taken in order to segment the phase information between the MSB and LSB with this architecture. Various tradeoffs will exist between the shaping of the noise and the desired phase noise performance from the PLL. One approach is to use a sigma delta modulator to implement the partitioning between the MSB and phase interpolator 12.

Figure 2:
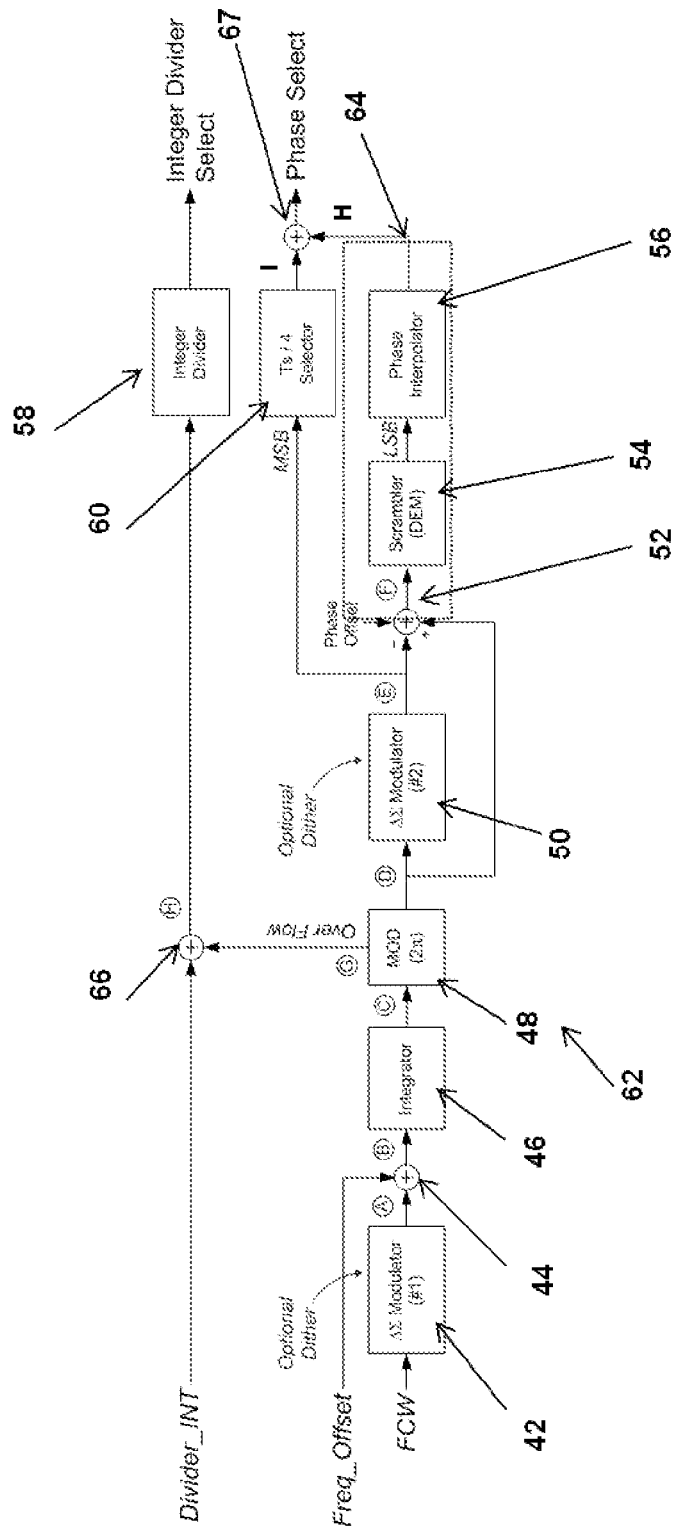
FIG. 2 is a schematic diagram illustrating a possible implementation for the segmented module in FIG. 1 formed in accordance with the invention.

One possible implementation for the segmentation module 18 is shown above in FIG. 2. The function of this circuitry is to generate control signals for an integer divider 58, an MSB sub-phase generator or phase selector (denoted by 'Ts/4 Selector' in FIG. 2) 60, and an LSB sub-phase generator 64, in such a way as to achieve the desired output frequency from the PLL, while reducing spur levels due to non-idealities. Here, the output of a $\Delta\Sigma$ modulator or segmentation modulator 50 is implemented by dividing down a faster clock, however sub-phases of the VCO (or other techniques) could also be used. Also, the LSB sub-phase generation 64 is accomplished with a phase interpolator 56; however a delay line or other generation technique could also be used.

Input control words Divider_INT, Freq_Offset, and FCW set the target frequency of the PLL. Divider_INT sets the integer portion of the divide value while Freq_Offset and FCW set the fractional portion of the divider value. Freq_Offset has the same resolution as the phase interpolator 56. FCW has a much finer resolution and is processed by the $\Delta\Sigma$ modulator 42 to increase the effective resolution of the integer divider 58 beyond that of the phase interpolator 56. The output (A) of the $\Delta\Sigma$ modulator 42 is added, using an adder 44, to Freq_Offset in order to determine the total fractional step for the subsequent clock cycle (A). This result (B) is integrated (C) using an integrator 46 and then checked for overflow. If the output (C) of the integrator 46 is greater than $2\pi$ ($T_S$), one cycle can be subtracted from the fractional value using a modulus (denoted by 'MOD ($2\pi$)' in FIG. 2) 48 in order to keep the result (D) within the range of the sub-phase generators 62, 64. The overflow (G) is then added, using an adder 66, to the integer divide value Divider_INT to form the control word (H) for the integer divider 58. The fractional control word (D) is then passed to the $\Delta\Sigma$ modulator or segmentation modulator 50 that performs the segmentation function.

The segmentation modulator 50 then produces an output (E) composed of the desired phase along with quantization error. The number of output levels from the segmentation modulator's 50 output (E) can match the number of levels used by the coarse (MSB) sub-phase selector 60. The output (E) of the segmentation modulator 50 is subtracted, using an adder 52, from its input (D) in order to determine the quantization error (F). The error signal (F) includes a +180° phase offset to center it for the input range of a phase interpolator 56. The error signal (F) is then scrambled (or mismatched shape in some other form) using a scrambler (denoted by 'Scrambler (DEM) in FIG. 2) 54 and passed to the phase interpolator 56 to implement the fine phase control.

Note there are many variations of the architecture described here, especially in terms of relative time step between the phase selector and the VCO clock. In the example above, the phase selector 60 uses time steps that are $1/4^{th}$ the size of the VCO clock period. Correspondingly the range of the interpolator is equal to one VCO clock period since 4 steps are used in the phase selector. This relationship is not fixed and can be changed. For example, the phase selector could use steps equivalent to one period of the VCO clock, and the interpolator could have a range equal to $4T_S$. Additionally, the numbers of steps need not be set to four and can be changed as well. Using an adder 67, the output (H) of the phase interpolator 56 is added, using an adder 67, with the output (I) of the phase selector 60 to produce a phase select signal.

The key function of this solution is performed by the segmentation modulator 50. Since the control signal for the phase interpolator 56 only includes quantization noise, the effects of mismatch between the phase interpolator 56 and phase selector 60 are minimized by this approach. In addition, if the quantization noise passed to the phase interpolator 56 is largely random in behavior and varying on the order of the full range of the phase interpolator 56, the tonal behavior can be greatly attenuated.

FIGS. 3A-3B show polar plots that use first order segmentation. In particular, FIG. 3A shows the results without dithering while FIG. 3B shows dithering has been added. The phase mapping shown of FIG. 3A is a more complex locus focused over a narrower range of values. The narrow range of values results from the first-order modulation that ensures the maximum deviation to be less than ±90°. Recall the offset that was added to the control for the phase interpolator 56 shifts the mid-point by 180°. FIG. 3B shows the effect of adding dither to the first order modulator 50. The dither included here was slightly larger than ½ LSB in order to significantly increase the variation seen at the output (E) of the modulator 50. Since the added quantization noise from the inclusion of dither is cancelled by the phase interpolator 56 output, the dither does not increase the phase noise of the PLL; instead this only affects the way phase is partitioned between the MSB and LSB sub-phase generators. Note the locus from the dithered modulator results in a significantly more complex phase locus.

Figure 4B:
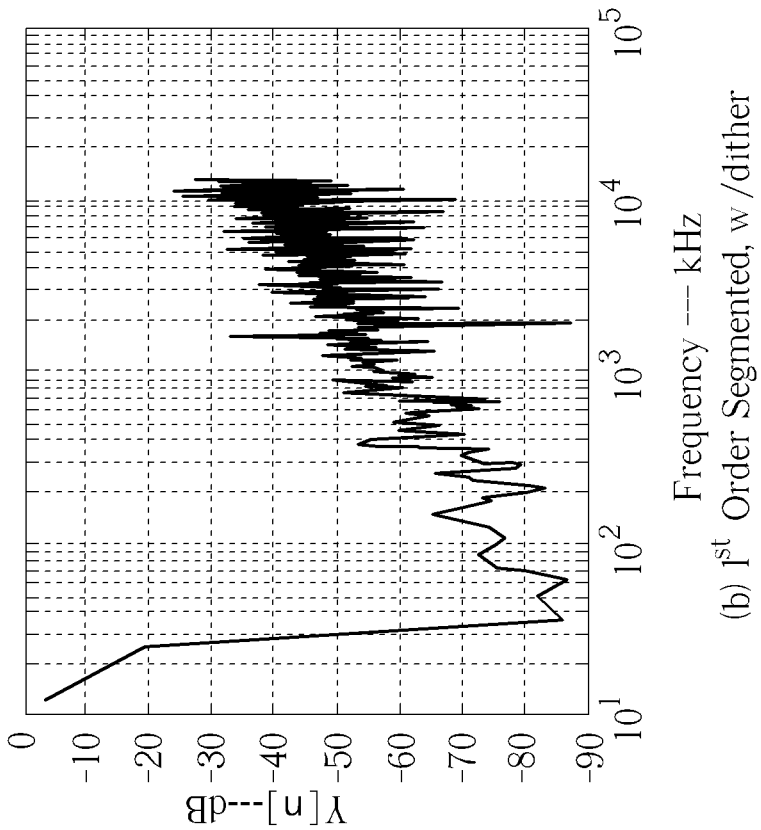
FIGS. 4A-4B are FFT plots illustrating the output of a phase interpolator used in accordance with the invention.
Figure 4A:
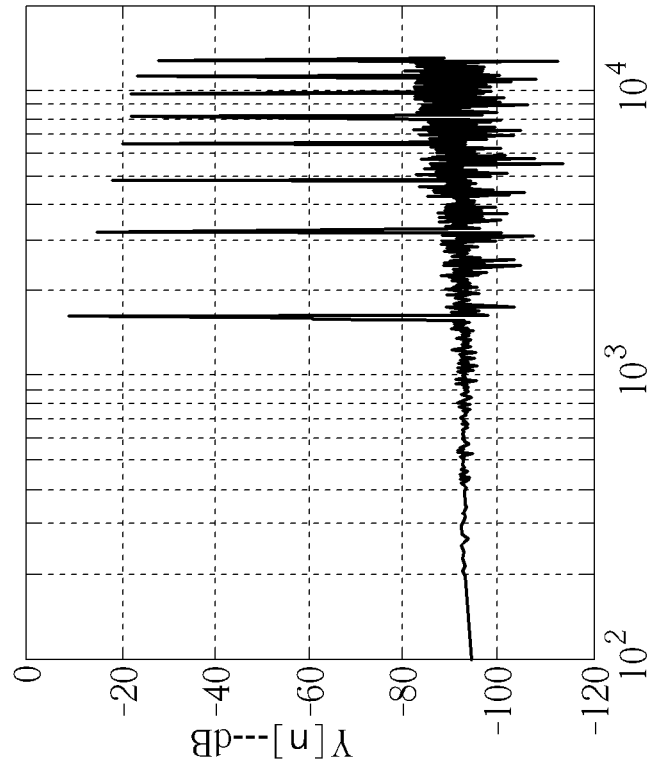

An alternate way of comparing the accumulator-based approach used in the prior art and the inventive segmented approach is to plot the FFT of the phase signal processed by the phase interpolator 56, as shown in FIGS. 4A-4B. FIG. 4A shows the FFT of the accumulator-based Fractional-N PLL used in the prior art. As expected, large tones are present at fraction of the reference clock frequency and all of its harmonics. In contrast, using the first order segmentation, the tones are greatly attenuated, as shown in FIG. 4B.

Figure 5:
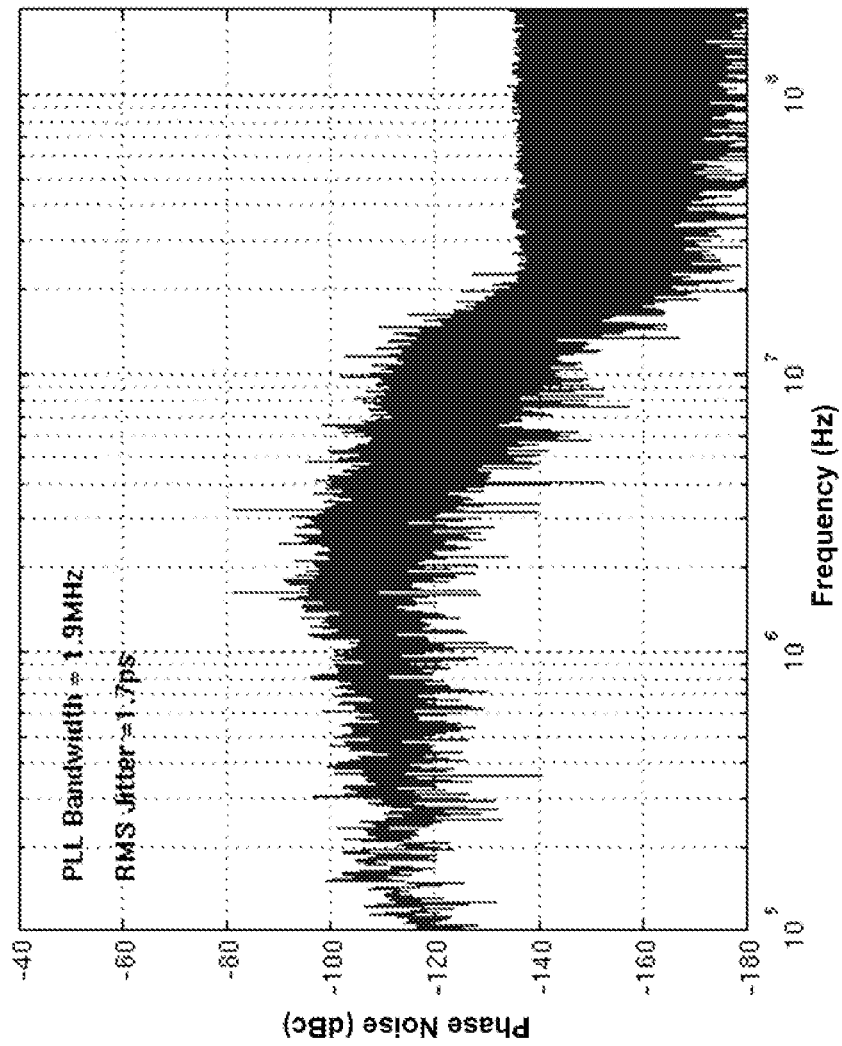
FIG. 5 is a phase noise plot illustrating first order segmentation with dither.

As a last comparison between the approaches, FIG. 5 shows the phase noise plot for the preceding example (1st order segmentation with dither) with the inclusion of 1% gain error and 0.5% INL in the phase interpolator. In this case, the worst-case spur has been decreased by over 30 dB and the integrated jitter has been reduced by more than 18 dB.

Figures 6A, 6B:
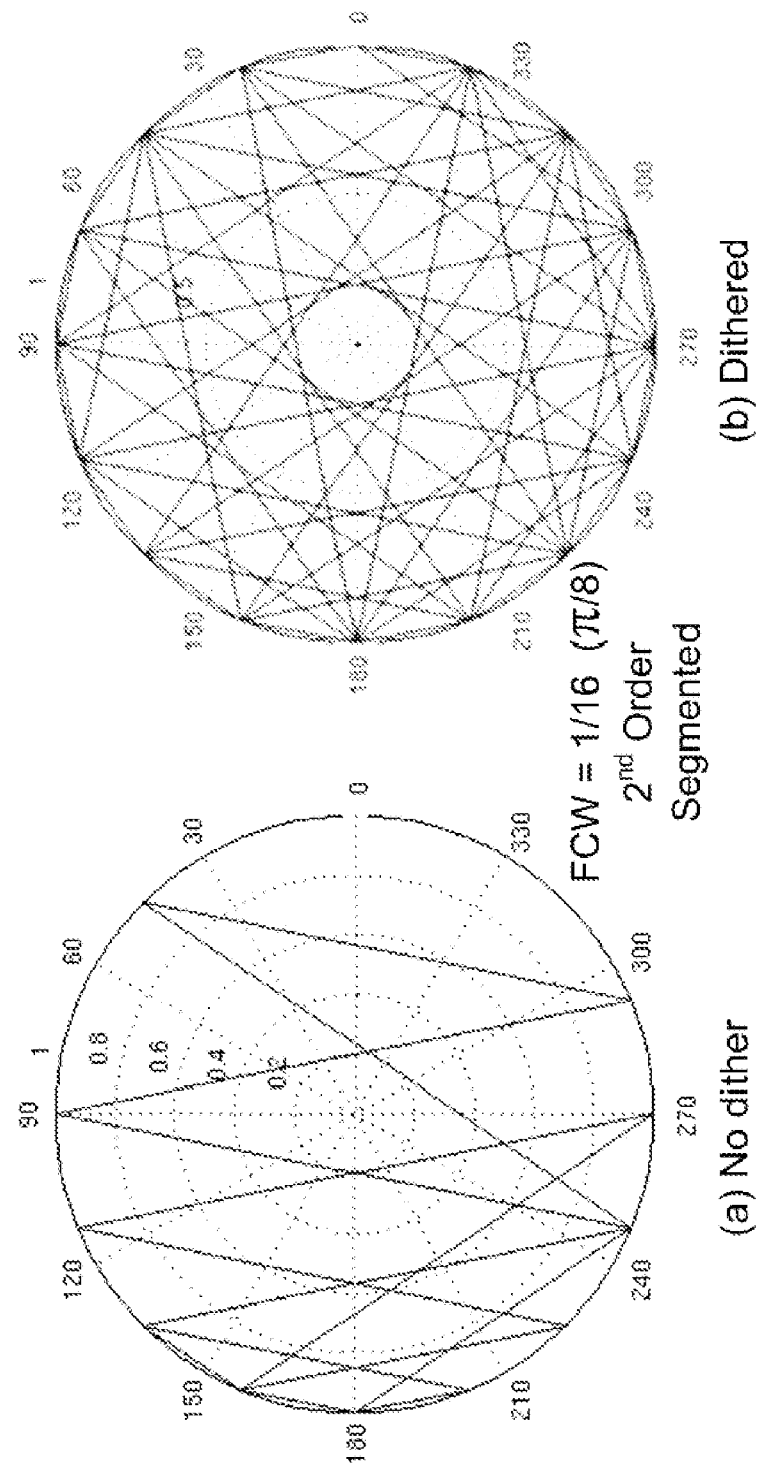
FIGS. 6A-6B are polar plots illustrating second order segmentation for a Fractional-N PLL.

There is no reason that the segmentation modulator 50 must be a first order architecture; higher-order modulator can also be used. Extending the previous example with FCW=$\frac{1}{16}$, the phase locus for a solution using second order segmentation is shown in FIGS. 6A-6B. As would be expected, the higher-order noise shaping creates larger movement in the phase of the interpolator 56 as shown in FIG. 6A. Adding dither to the second order solution produces a phase locus where almost all possible phase transitions are exercised, as shown in FIG. 6B.

Figure 7:
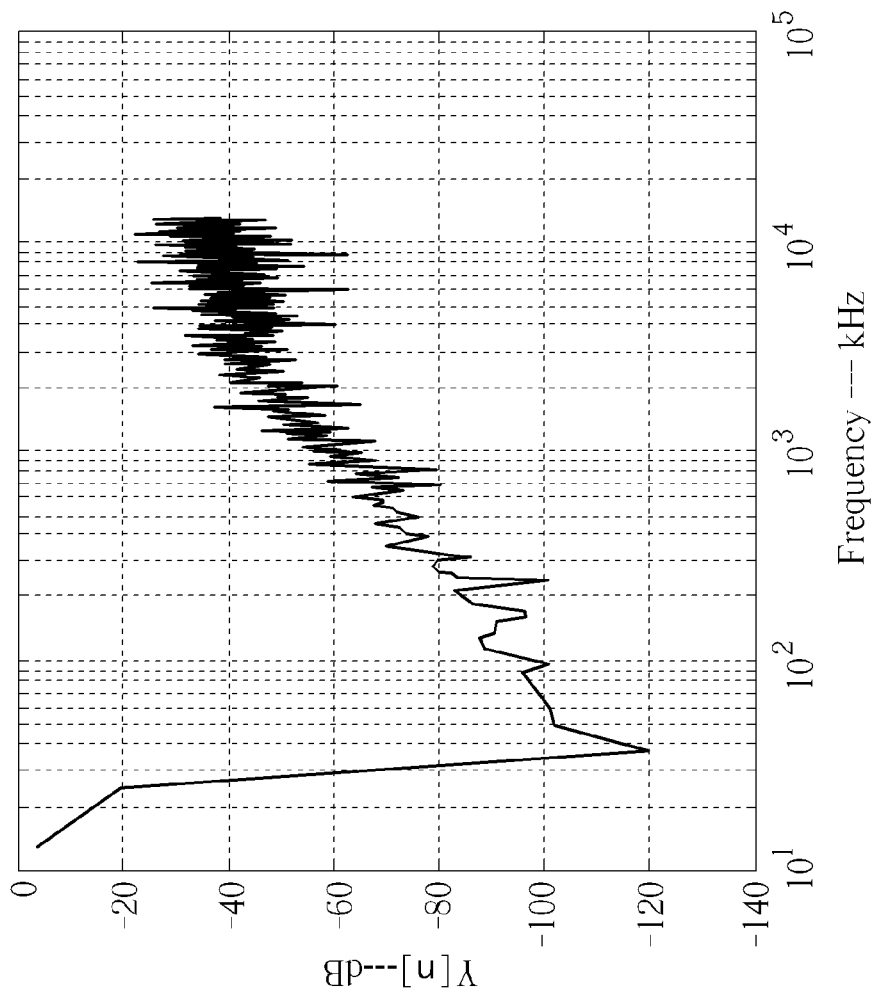
FIG. 7 is an FFT plot illustrating the output of a phase interpolator of second order segmentation with dither.

FIG. 7 is a graph illustrating the FFT of the phase from the phase interpolator 56. Comparing with FIG. 4B, the fundamental tone at 1.625 MHz has been decreased by about 5 dB when compared to the first order segmentation, while higher frequency content exceeds that values observed with first order segmentation. This behavior is as expected since the second order modulation has more aggressive noise shaping, and therefore larger levels of high frequency quantization noise (the standard tradeoff for reduced in-band quantization noise and reduced levels of idle tones).

Figure 8:
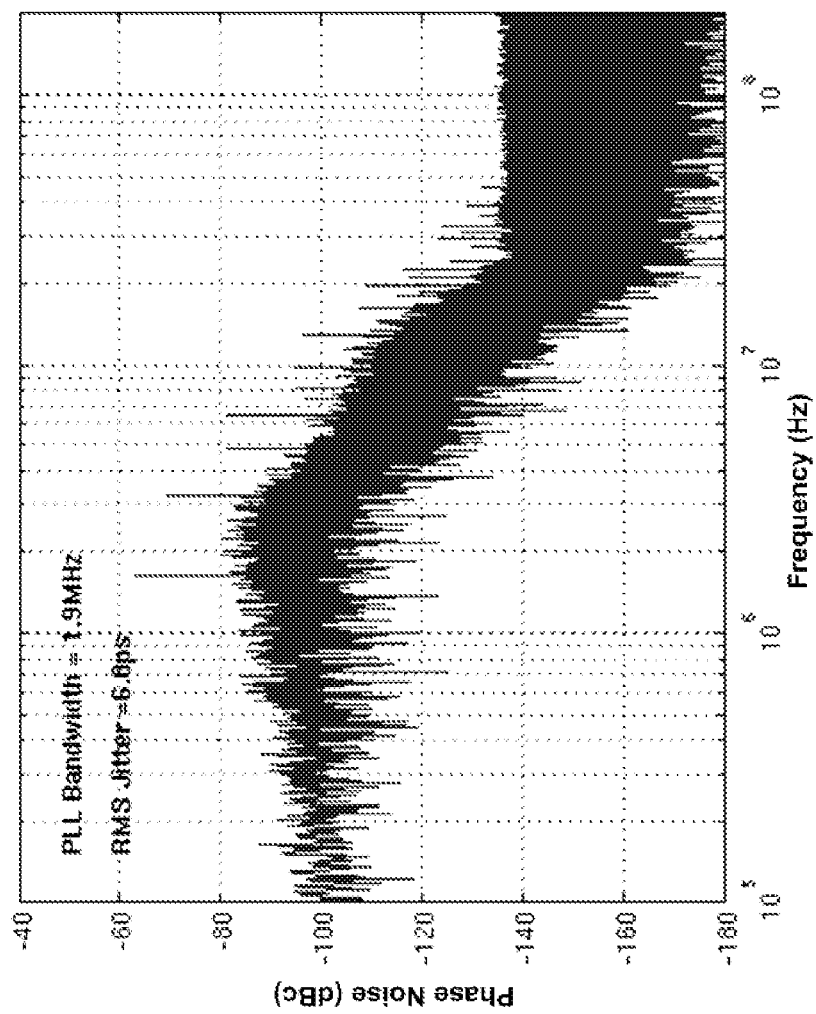
FIG. 8 is a graph illustrating the phase noise that results when using the second order segmentation scheme.

FIG. 8 shows the phase noise that results when using the second order segmentation scheme with the previous level of nonidealities in the interpolator. Compared with FIG. 5, the 1.625 MHz spur has actually increased by near 20 dB. The reason for this is that the output of the dithered second order modulator requires more range than the interpolator and phase selectors can produce. To resolve this limitation, clipping is used which results in some signal content ending up in the interpolator (versus just quantization noise). This causes the increased spur levels. The integrated jitter is just over 7 dB less than the accumulator-based solution, but still 10.9 dB higher than the first order segmentation.

Along with the aforementioned clipping, a significant portion of the delta between the first and second order segmentation schemes is due to the larger high-frequency content from the second order noise shaping. In the example here, the PLL bandwidth was set at 1.9 MHz, and therefore more sensitive to more aggressive noise shaping. As the case with standard Fraction-N PLL design, there is a tradeoff between the optimal order of noise shaping used and the bandwidth of the PLL. In this example, it appears first order modulation is optimal. This will vary depending on conditions. Note, a possible option for removing the overflow into the sub-phase generators that occurred with second order modulation would be to increase the number of levels used by the phase selector and/or increase the range of the interpolator.

While the case of FCW=$\frac{1}{16}$ is fairly simple, it may not represent the best usage for this PLL. After a bit of investigation, an example was identified that it thought to reasonably approximate (or at least, more closely approach) a worst-case scenario for the benefits of the segmented Fractional-N PLL architecture. In addition, it exercises much more complex underlying tones in the modulation as compared with the simple example of FCW=$\frac{1}{16}$. Here, the fractional control word was set to a value of 231/256 plus $595/2^{18}$, or rather FCW is approximately equal to 0.905. The output clock is ~1.96 GHz. Note in this example the segmentation is performed using an interpolator with a range of $4T_S$. As a result, the MSB of the sub-phase generator actually uses a step size of one entire VCO clock period—a variant described earlier.

Figure 9A:
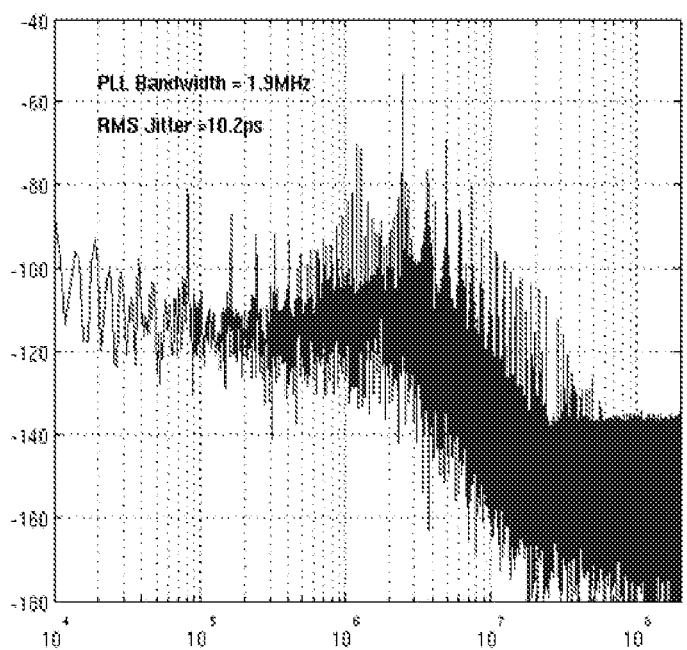
FIGS. 9A-9B are graphs illustrating the phase plots for a phase interpolator in an accumulator-based Fractional-N PLL and first order segmentation having a bandwidth (BW) being 1.9 MHz.
Figure 9B:
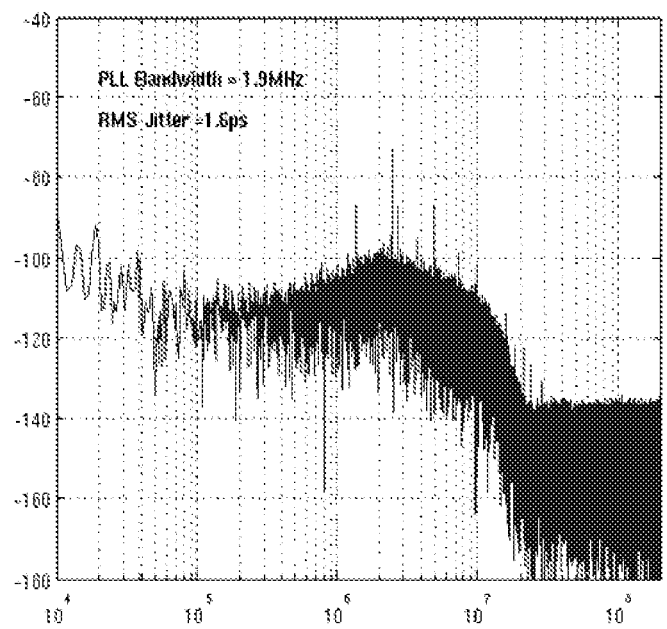
Figure 10A:
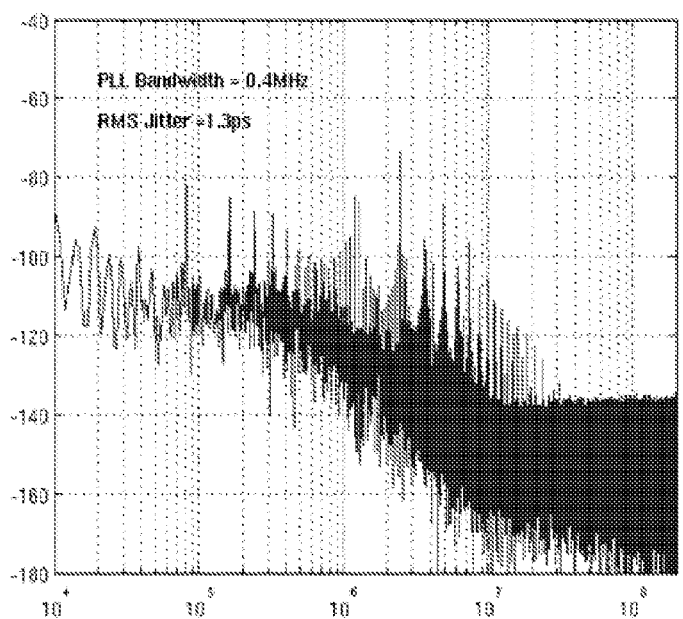
FIGS. 10A-10B are graphs illustrating the phase plots for a phase interpolator in an accumulator-based Fractional-N PLL and first order segmentation having a bandwidth (BW) being 0.4 MHz.
Figure 10B:
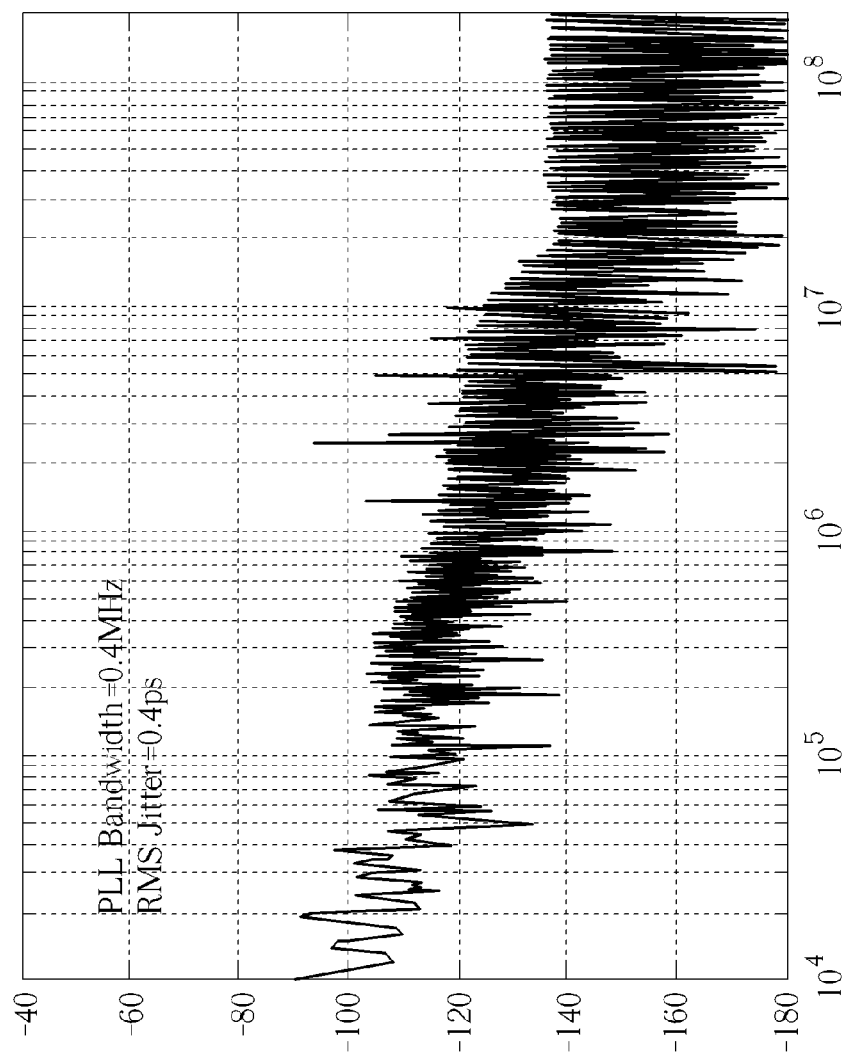

Inspection of FIG. 9A reveals a significantly more complex tonal behavior as compared with the previous example. However by comparing this with FIG. 9B, almost all of the spurs have either been removed or greatly attenuated with the inclusion of segmentation. The net result—the peak spur level and (integrated) jitter have been reduced by approximately 19 dB and 16.1 dB, respectively. It is thought that the residual tones in FIG. 9B result from the gain error in the interpolator. FIGS. 10A-10B provide the results from the same analysis, only with the PLL BW reduced to 0.4 MHz. While the peak spur comparison does not change, the jitter improvement is reduced to 10.2 dB since more of the spurious content is filtered with the reduced bandwidth.

Figure 11:
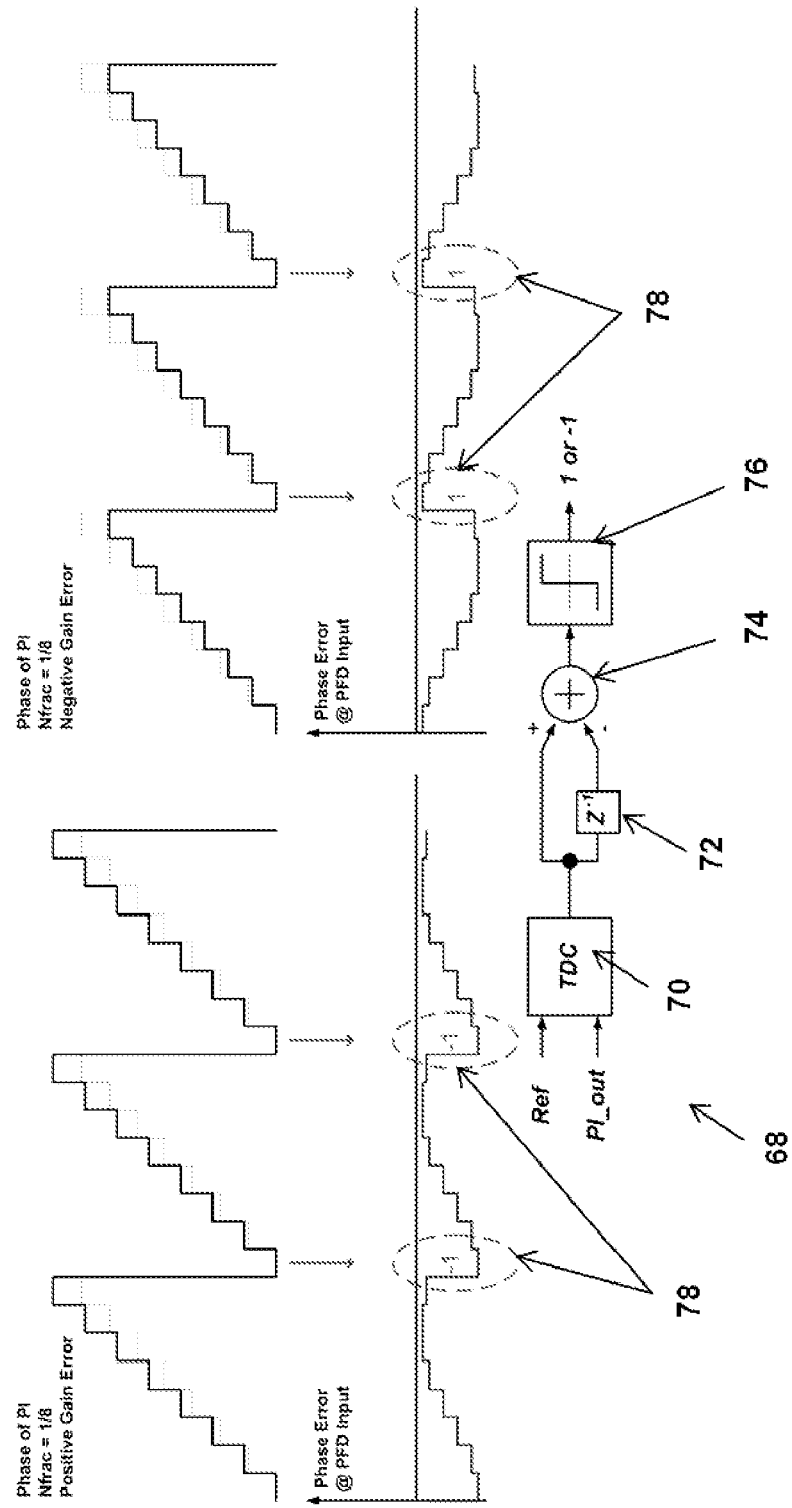
FIG. 11 is a graph and schematic diagram illustrating foreground calibration.

While the segmented approach greatly reduces spurs, residual gain error in the sub-phase generator can place a limit to the level of spur attenuation that is achieved. To further reduce the level of spurs in the phase noise plot, some type of gain calibration will be necessary. A foreground calibration technique 68 to reduce gain error is shown in FIG. 11. Before normal operation, the feedback path is switched back to DDS type architecture (simple accumulator plus interpolator). A low value FCW is used such that phase selection code looks like staircase as shown above. If gain error is present, a large step 78 will appear between adjacent codes (minimum code and maximum code) when the phase wraps around at $2\pi$ (360°).

A simple TDC (Time-to-Digital Converter) 70 can be used to derive the phase error at the PFD inputs Ref and PI_out, and subtract it using an adder 74 from a preceding step using a $z^{-1}$ module 72 to determine the step size 78. Only the polarity, using a step module 76, of the step size 78 can be used in the calibration algorithm 68 in order to adjust the gain. Once the polarity begins to toggle back and forth between successive calibration cycles the adjustment is complete. The accuracy of the trim is limited by the resolution of the TDC 70. Note the TDC 70, as used here, is relatively insensitive to non-idealities; since only the polarity of a time step is used for the calibration, (static) time offsets are effectively removed (i.e. $1-z^{-1}$).

Figure 12:
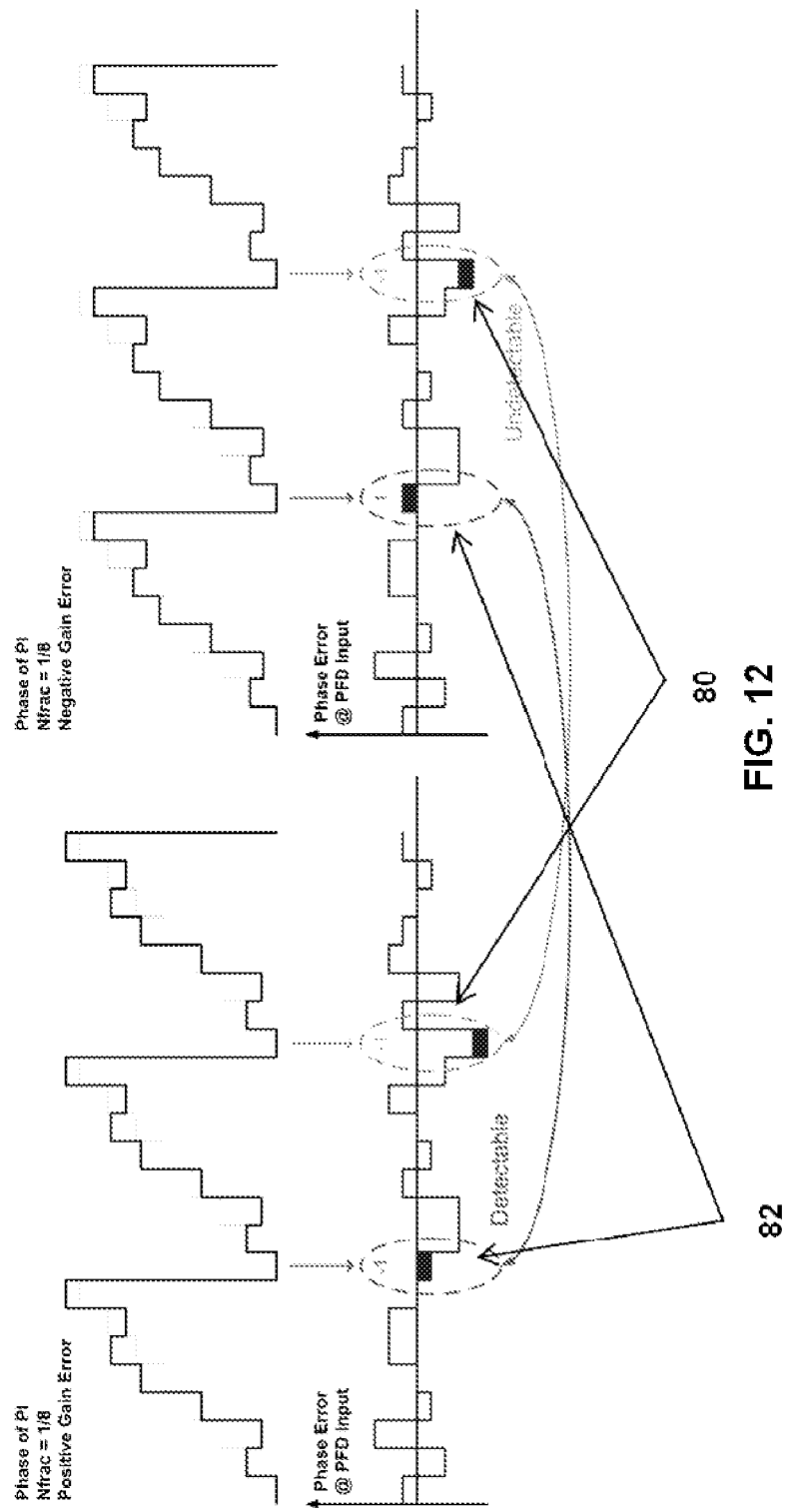
FIG. 12 is a graph illustrating the gain error that may be hidden by the quantization noise introduced from a $\Sigma$-$\Delta$ modulator.

Depending on the application, foreground calibration may not always be possible. As a result, a background calibration procedure has also been developed. The background calibration works in a similar fashion to the foreground calibration, however with some additional complications. Since the modulator 42 can be working during the background calibration, the phase step caused by the gain error that occurs when the interpolator wraps around may not be evident. Instead the phase step may be hidden by the quantization noise introduced from the modulator 42, as shown by circles 80 of FIG. 12. Note circles 82 are the detectable quantization noise described in FIG. 11. As a result, the gain error phase difference may not always be detectable every time the phase wraps around.

Figure 13:
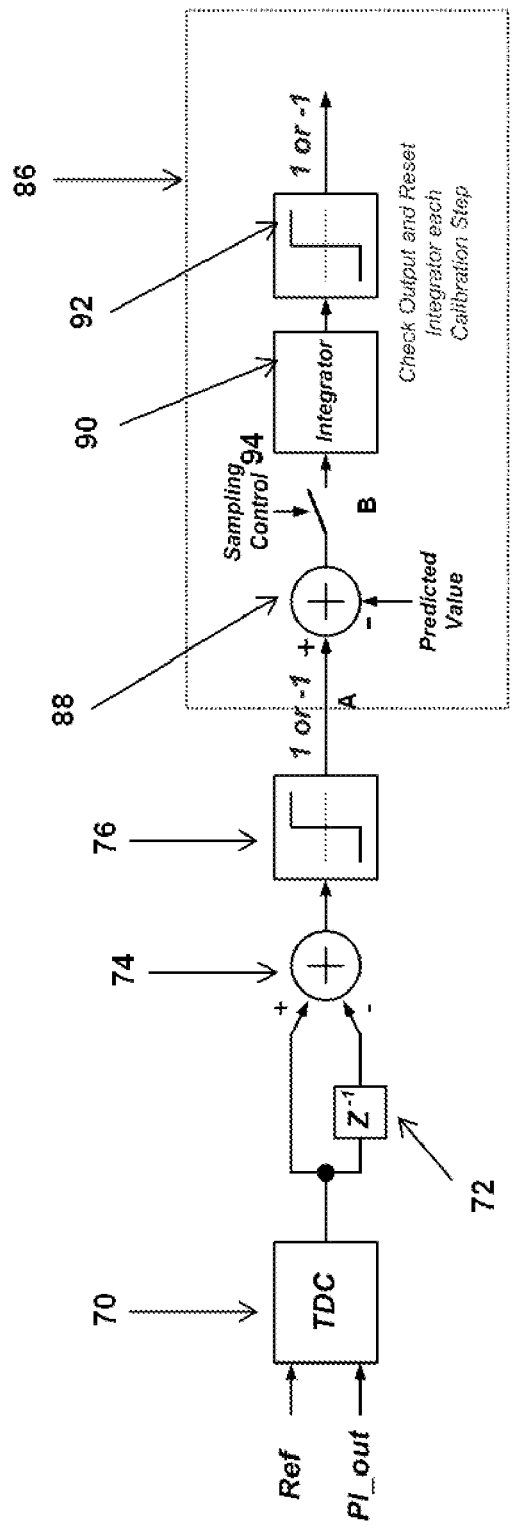
FIG. 13 is a schematic diagram illustrating a background calibration used in accordance with the invention.

To work around the limitation caused by the inclusion of phase noise, a slightly different approach was taken for the background calibration as shown in FIG. 13. The elements 70-76 of the foreground calibration 68 are included with a background calibration module 86. The background calibration module 86 includes an adder module 88 that receives the output (A) of the step module 76 and subtracts that value from the predicted value. An integrator 90 receives the output (B) of the adder module 88, which is integrated to determine the average error over a period of time. A step module 92 is provided that receives the output of the integrator 90 to determine the polarity of the step in an expected direction and outputs the expected polarity.

Instead of using the polarity of the phase difference at every wrap-around point in order to determine the calibration adjustment, the polarity of each phase step is first compared against the predicted polarity; the result is then integrated to determine the average error over a given period of time. In this way, when the polarity of the step is in the expected direction, the result is neglected. Only when there is a delta from the expected error does the result affect the calibration. Note since the modulator is completely digital, the expected polarity of the phase step is readily accessible. It should also be noted that this technique may not be applied to all FCW settings.

Using this approach, it is possible that the quantization noise will be patterned such that the error in the polarity at the phase wrap-around point will always be swamped by the quantization noise. If so, the algorithm can be altered to use points (other than the phase wrap-around) where the nominal phase error is either zero or very small, thereby allowing the technique to be applied successfully. Note the calibration circuit for this modified approach would still be represented by FIG. 13, only the calibration points (phase steps) would be changed to improve convergence. This would be accomplished using the sampling control signal 94 that gates the input to the integrator 90.

Although the present invention has been shown and described with respect to several preferred embodiments thereof, various changes, omissions and additions to the form and detail thereof, may be made therein, without departing from the spirit and scope of the invention.

What is claimed is:

1. A Fractional-N PLL device comprising:
   a phase frequency detector module that receives a first clock and a second clock that is associated with a feedback path arrangement;
   a coarse phase adjustment module that receives a coarse phase component and an output signal associated with a divider module used in the feedback path arrangement and performs a coarse phase adjustment;
   a fine phase adjustment module that performs fine phase adjustment using a fine phase component and the coarse phase adjustment as input to produce the second clock, the fine phase adjustment module nominally cancels most or all of the quantization noise present during the coarse phase adjustment, thereby greatly reducing the net phase noise of the divider module; and
   a segmentation module that receives a control signal and generates the coarse phase component and the fine phase component that are provided to the fine phase adjustment module and the coarse phase adjustment module for processing.

2. The Fractional-N PLL of claim 1, wherein the fine phase adjustment module comprises a phase interpolator, delay line, a sub-phase of voltage control oscillator, or combination thereof.

3. The Fractional-N PLL of claim 1, wherein the fine phase adjustment module comprises and arrangement having a scrambler and a phase interpolator.

4. The Fractional-N PLL of claim 1, wherein the coarse phase component comprises a target divide value and quantization noise.

5. The Fractional-N PLL of claim 1, wherein the fine phase component comprises quantization noise.

6. The Fractional-N PLL of claim 1, wherein the coarse phase adjustment module comprises a phase selector.

7. The Fractional-N PLL of claim 1, wherein the coarse phase adjustment module comprises a sub-phase, a divided aspect, or full clock phase from a voltage control oscillator.

8. The Fractional-N PLL of claim 1, wherein the segmentation module comprises a first order sigma delta modulator, second order sigma delta modulator, or combination thereof.

9. The Fractional-N PLL of claim 8, wherein the first order sigma delta modulator comprises dithering or without dithering.

10. The Fractional-N PLL of claim 8, wherein the second order sigma delta modulator comprises dithering or without dithering.

11. A method of performing the operation of a Fractional-N PLL device comprising:
    receiving a first clock and a second clock that is associated with a feedback path arrangement using a phase frequency detector module;
    receiving a coarse phase component and an output signal associated with a divider module used in the feedback path arrangement and performs a coarse phase adjustment using a coarse phase adjustment module;
    performing fine phase adjustment using a fine phase adjustment module that receives a fine phase component and the coarse phase adjustment as input to produce the second clock, the fine phase adjustment module nominally cancels most or all of the quantization noise present during the coarse phase adjustment, thereby greatly reducing the net phase noise of the divider module; and
    receiving a control signal and generating the coarse phase component and the fine phase component using a segmentation module that are provided to the fine phase adjustment module and the coarse phase adjustment module for processing.

12. The method of claim 11, wherein the fine phase adjustment module comprises a phase interpolator, delay line, a sub-phase of voltage control oscillator, or combination thereof.

13. The method of claim 11, wherein the fine phase adjustment module comprises and arrangement having a scrambler and a phase interpolator.

14. The method of claim 11, wherein the coarse phase component comprises a target divide value and quantization noise.

15. The method of claim 11, wherein the fine phase component comprises quantization noise.

16. The method of claim 11, wherein the coarse phase adjustment module comprises a phase selector.

17. The method of claim 11, wherein the coarse phase adjustment module comprises a sub-phase, a divided aspect, or full clock phase from a voltage control oscillator.

18. The method of claim 11, wherein the segmentation module comprise a first order sigma delta modulator, second order sigma delta modulator, or combination thereof.

19. The method of claim 18, wherein the first order sigma delta modulator comprises dithering or without dithering.

20. The method of claim 18, wherein the second order sigma delta modulator comprises dithering or without dithering.

* * * * *

UNITED STATES PATENT AND TRADEMARK OFFICE
CERTIFICATE OF CORRECTION

PATENT NO. : 8,653,869 B2  
APPLICATION NO. : 13/615441  
DATED : February 18, 2014  
INVENTOR(S) : Tsung-Kai Kao et al.

Page 1 of 1

It is certified that error appears in the above-identified patent and that said Letters Patent is hereby corrected as shown below:

On the title page, item (73), correct the name of the assignee from "Media Tek Singapore Pte. Ltd." to --MediaTek Singapore Pte. Ltd.--.

Signed and Sealed this
Twenty-seventh Day of May, 2014

Michelle K. Lee
*Deputy Director of the United States Patent and Trademark Office*